US006835633B2

(12) United States Patent
Boyd et al.

(10) Patent No.: US 6,835,633 B2
(45) Date of Patent: Dec. 28, 2004

(54) SOI WAFERS WITH 30-100 Å BURIED OXIDE (BOX) CREATED BY WAFER BONDING USING 30-100 Å THIN OXIDE AS BONDING LAYER

(75) Inventors: Diane C. Boyd, LaGrangeville, NY (US); Hussein I. Hanafi, Basking Ridge, NJ (US); Erin C. Jones, Tuckahoe, NY (US); Dominic J. Schepis, Wappingers Falls, NY (US); Leathen Shi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/202,329

(22) Filed: Jul. 24, 2002

(65) Prior Publication Data

US 2004/0018699 A1 Jan. 29, 2004

(51) Int. Cl.$^7$ ................................................ H01L 21/76
(52) U.S. Cl. ........................ 438/409; 438/406; 438/408
(58) Field of Search ........................ 438/459, 455–438, 438/406–413, 149; 257/347, 72, 59

(56) References Cited

U.S. PATENT DOCUMENTS

| 6,380,046 B1 | * | 4/2002 | Yamazaki ................... 438/409 |
| 6,455,398 B1 | * | 9/2002 | Fonstad et al. ............. 438/459 |
| 2002/0185684 A1 | * | 12/2002 | Cambell et al. ............ 257/347 |

* cited by examiner

Primary Examiner—Dung A. Le
(74) Attorney, Agent, or Firm—Scully, Scott, Murphy & Presser; Robert M. Trepp

(57) ABSTRACT

A method of fabricating a SOI wafer having a gate-quality, thin buried oxide region is provided. The wafer is fabricating by forming a substantially uniform thermal oxide on a surface of a Si-containing layer of a SOI substrate which includes a buried oxide region positioned between the Si-containing layer and a Si-containing substrate layer. Next, a cleaning process is employed to form a hydrophilic surface on the thermal oxide. A carrier wafer having a hydrophilic surface is provided and positioned near the substrate such that the hydrophilic surfaces adjoin each other. Room temperature bonding is then employed to bond the carrier wafer to the substrate. An annealing step is performed and thereafter, the Si-containing substrate of the silicon-on-insulator substrate and the buried oxide region are selectively removed to expose the Si-containing layer.

7 Claims, 4 Drawing Sheets

SOI WAFERS WITH 30-100 Å BURIED OXIDE (BOX) CREATED BY WAFER BONDING USING 30-100 Å THIN OXIDE AS BONDING LAYER

FIELD OF THE INVENTION

The present invention relates to semiconductor devices, and more particularly to a method of fabricating a silicon-on-insulator (SOI) wafer containing a gate-quality, thin (on the order of about 30 to about 100 Å) buried oxide (BOX) region. Such wafers are needed for the fabrication of double-gated metal oxide semiconductor field effect transistors (MOSFETS).

BACKGROUND OF THE INVENTION

Over the past twenty-five years or so, the primary challenge of very large scale integration (VLSI) has been the integration of an ever-increasing number of MOSFET devices with high yield and reliability. This was achieved mainly in the prior art by scaling down the MOSFET channel length without excessive short-channel effects. As is known to those skilled in the art, short-channel effects are the decrease of threshold voltage $V_t$ in short-channel devices due to two-dimensional electrostatic charge sharing between the gate and the source/drain regions.

To scale down MOSFET channel lengths without excessive short-channel effects, gate oxide thickness has to be reduced while increasing channel-doping concentration. However, Yan, et al. "Scaling the Si MOSFET: From bulk to SOI to bulk", IEEE Trans. Elect. Dev., Vol. 39, p. 1074, July 1992, have shown that to reduce short-channel effects for sub-0.05 $\mu$m MOSFETs, it is important to have a backside-conducting layer present in the structure that screens the drain field away from the channel. The Yan, et al. results show that the double-gated MOSFETs and MOSFETs with a top gate and a backside ground plane are more immune to short-channel effects and hence can be scaled to shorter dimensions than conventional MOSFETs.

The structure of prior art double-gated MOSFETs consists of a very thin insulating layer for the channel, with two gates, one on each side of the channel. The two gates are electrically connected so that they serve to modulate the channel. Short-channel effects are greatly suppressed in such a structure because the two gates very effectively terminate the drain field line preventing the drain potential from being felt at the source end of the channel. Consequently, the variation of the threshold voltage with drain voltage and with gate length of a prior art double-gated MOSFET is much smaller than that of a conventional single-gated structure of the same channel length.

In the prior art, SOI wafers can be formed using a so-called 'SMART' cut process. Although SMART cutting can be used in forming a thick buried oxide region, problems arise when SMART cutting is employed in forming a thin buried oxide region (30–100 Å). The reason that SMART cut technology cannot be used in fabricating SOI wafers having thin buried oxide regions is that SMART cut technology relies on the implantation of hydrogen ions in a Si wafer to form a uniform cut upon annealing the wafer at elevated temperatures.

To date, there are no adequate means for preparing the substrates required to fabricate double-gated MOSFET structures. The required substrates needed are mainly SOI wafers having a BOX region on the order of from about 30 to about 100 Å. Since the BOX region in these substrates will act as a backgate dielectric in a double-gated MOSFET structure, a gate oxide quality BOX region is required. Hence, there is continued need for developing a method of preparing SOI wafers having a gate-quality, thin BOX region.

SUMMARY OF THE INVENTION

The present invention relates to a method of forming a SOI wafer that contains a gate-quality, thin buried oxide (BOX) region. The term "thin" BOX region is used herein to denote a BOX region having a thickness of from about 30 to about 100 Å, whereas the term "gate-quality" denotes that the BOX region of the present invention is a thermal oxide which has little or no defects associated therewith. Thermal oxides are generally characterized as an oxide layer that has a surface state charge density of about $10^{10}$ cm$^{-2}$ or less.

Specifically, the SOI wafers having a gate-quality, thin BOX region are fabricated in the present invention by utilizing a method which includes the steps of:

forming a substantially uniform thermal oxide film on a Si-containing layer of a silicon-on-insulator substrate, said thermal oxide film having a hydrophilic surface and said substrate having a buried oxide region positioned between said Si-containing layer and an underlaying Si-containing substrate;

positioning a carrier wafer having a hydrophilic surface such that the hydrophilic surfaces of the thermal oxide film and the carrier wafer adjoin each other;

bonding said hydrophilic surfaces together at about room temperature to provide a bonded structure;

annealing said bonded structure to form a sacrificial oxide on exposed Si surfaces of said bonded structure;

selectively removing said sacrificial oxide and said Si-containing substrate from said bonded structure to expose said buried oxide region; and selectively removing said exposed buried oxide region to provide a SOI wafer that comprises said thermal oxide film sandwiched between the Si-containing layer of the SOI substrate and the carrier wafer.

It is emphasized herein that since the buried oxide region of the original silicon-on-insulator (SOI) substrate is removed by the method of the present invention, the quality of the original buried oxide layer is of no importance to the present invention. Therefore, the present invention can advantageously use, as the initial substrate, a SOI substrate which contains a low-quality buried oxide. That is, scrap SOI substrates having a low-quality buried oxide region, i.e., non-thermal oxide, can be used in the present invention.

In some embodiments of the present invention, the exposed Si-containing layer provided above can be thinned to a predetermined and desired thickness value using repeated oxidation and oxide removal processing steps.

DETAILED DESCRIPTION OF THE INVENTION

Figure 1A:
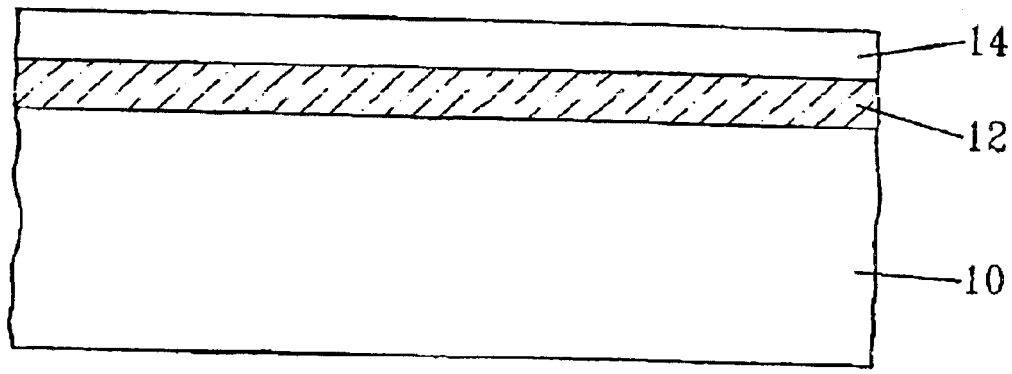
FIGS. 1A–1G are pictorial representations (through cross-sectional views) illustrating the basic processing steps that are employed in the present invention for fabricating a SOI wafer having a gate-quality, thin BOX region.

The present invention, which provides a method of fabricating a SOI wafer having a high-quality, thin buried oxide region, will now be described in more detail by referring to the drawings that accompany the present application.

As stated above, the present invention provides a method of fabricating a SOI wafer having a gate-quality, thin buried oxide region sandwiched between two Si-containing material layers. One primary use of the inventive SOI wafers is in the fabrication of double-gated MOSFET structures such as are described, for example, in co-assigned U.S. application Ser. No. 09/866,023, filed May 24, 2001, the entire content of which is incorporated herein by reference.

Figure 2:
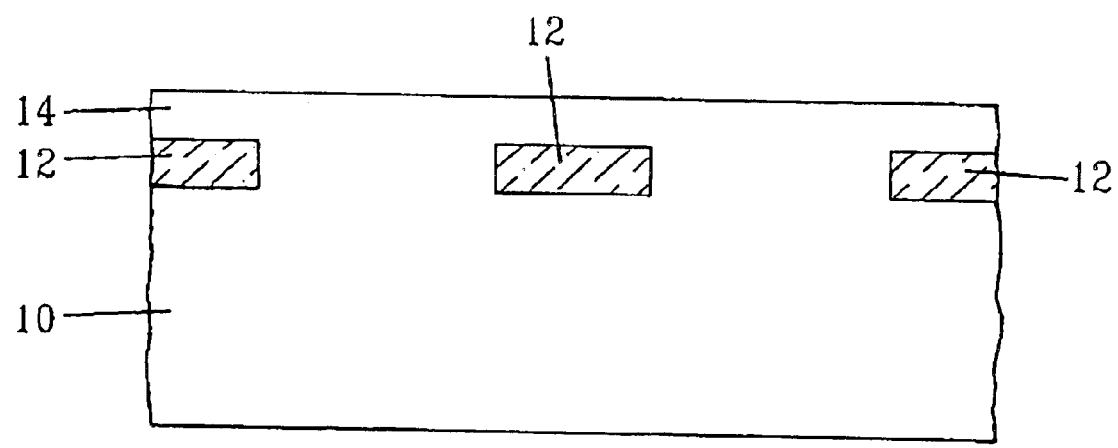
FIG. 2 is a pictorial representation of a SOI substrate having a non-continuous buried oxide region which can be employed in the present invention.

Reference is first made to FIG. 1A which shows an initial SOI substrate that can be employed in the present invention. Specifically, the initial SOI substrate of FIG. 1A comprises buried oxide layer 12 which electrically isolates Si-containing substrate 10 from Si-containing layer 14. It is noted that Si-containing layer 14 is the SOI layer of the final wafer, and active device regions can be present in layer 14. The term "Si-containing" as used herein denotes a material that includes at least silicon. Illustrative examples of such Si-containing materials include, but are not limited to: Si, SiGe, SiC, SiGeC, Si/Si, Si/SiC, and Si/SiGeC. Buried oxide region 12 may be a continuous buried oxide region, as is shown in FIG. 1A, or it may be a non-continuous, i.e., patterned, buried oxide region. The non-continuous buried oxide region is illustrated, for example, in FIG. 2. The non-continuous buried oxide regions shown FIG. 2 are discrete and isolated regions or islands that are surrounded by Si-containing layers, i.e., layers 10 and 14.

The SOI substrate may be formed utilizing conventional SIMOX (separation by ion implantation of oxygen) processes well known to those skilled in the art, as well as the various SIMOX processes mentioned in co-assigned U.S. patent applications Ser. No. 09/861,593, filed May 21, 2001; Ser. No. 09/861,594, filed May 21, 2001; Ser. No. 09/861,590, filed May 21, 2001; Ser. No. 09/861,596, filed May 21, 2001; and Ser. No. 09/884,670, filed Jun. 19, 2001 as well as U.S. Pat. No. 5,930,634 to Sadana, et al., the entire contents of each are incorporated herein by reference. Note that the process disclosed in the '590 application can be employed herein to fabricate the patterned substrate shown in FIG. 2. Alternatively, the SOI substrate material may be made using other conventional processes including, for example, a thermal bonding and cutting process.

In addition to the mentioned techniques, the initial SOI substrates employed in the present invention may be formed by deposition processes as well as lithography and etching (employed when fabricating a patterned substrate). Specifically, the initial structure may be formed by depositing an oxide film atop a surface of a Si-containing substrate, via a conventional deposition or thermal growing process, optionally patterning the oxide film by employing conventional lithography and etching; and thereafter forming a Si-containing layer atop the oxide layer using a conventional deposition process including, for example, chemical vapor deposition (CVD), plasma-assisted CVD, sputtering, evaporation, chemical solution deposition or epitaxial Si growth.

The thickness of the various layers of the initial SOI substrate may vary depending on the process used in making the same. Typically, however, Si-containing layer 14 has a thickness of from about 100 to about 200 nm. In the case of buried oxide layer 12, that layer may have a thickness of from about 100 to about 400 nm. The thickness of the Si-containing substrate layer, i.e., layer 10, is inconsequential to the present invention. It is noted that the thicknesses provided above are exemplary and by no ways limit the scope of the present invention.

As stated above, the quality of the buried oxide region of the original SOI substrate is of no importance to the present invention. Therefore, at this point of the present invention low-quality oxides which contain defects and, thus are leaky, as well as high-quality oxides can be used. Because the present invention contemplates the use of SOI substrates having defect-containing buried oxide regions, the present invention provides a means to use scrap SOI substrates that would otherwise be disregarded by the manufacturer.

For simplicity, the processing steps of the present invention will be shown using the SOI substrate shown in FIG. 1A. Although the method of the present invention is described with respect to the SOI substrate shown in FIG. 1A, the present invention works equally well with the patterned SOI substrate shown in FIG. 2.

Figure 1B:
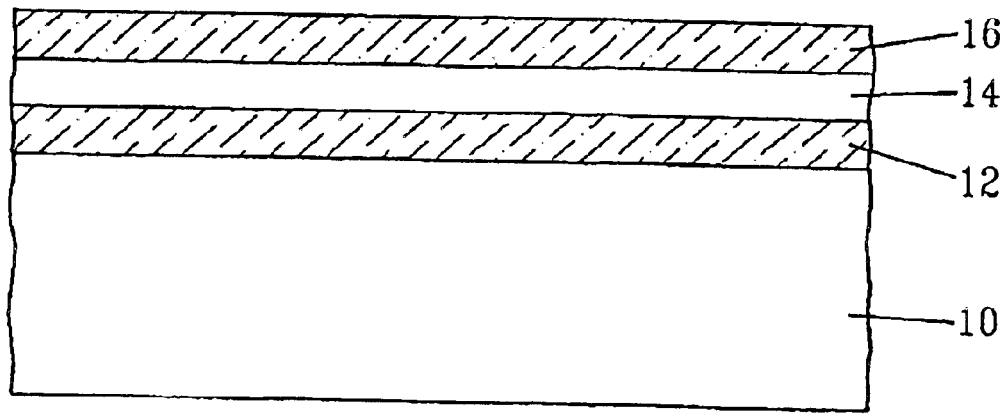

After providing the SOI substrate shown in either FIG. 1A or 2, a substantially-uniform thermal oxide film (denoted by reference numeral 16) is grown on the surface of Si-containing layer 14 providing the structure shown, for example, in FIG. 1B. The term "substantially uniform" when used in conjunction with the term "thermal oxide" denotes that the variation of the oxide thickness throughout the area where bonding will subsequently occur is less than or equal to ±5%. The thermal oxide film formed at this point of the present invention is grown utilizing a conventional oxidation process which is capable of forming a thermal oxide film that is free of nitrogen. Thermal oxide films that are free of nitrogen have been found to be substantially resistant to shrinking and/or expansion during a post bonding annealing step to be described in more detail hereinbelow. The thermal oxide layer grown in the present invention is a thin thermal oxide layer having a thickness of from about 30 to about 100 Å. It is noted that this thermal oxide film will become the buried oxide film of the final SOI wafer produced by the present invention.

Figure 1C:
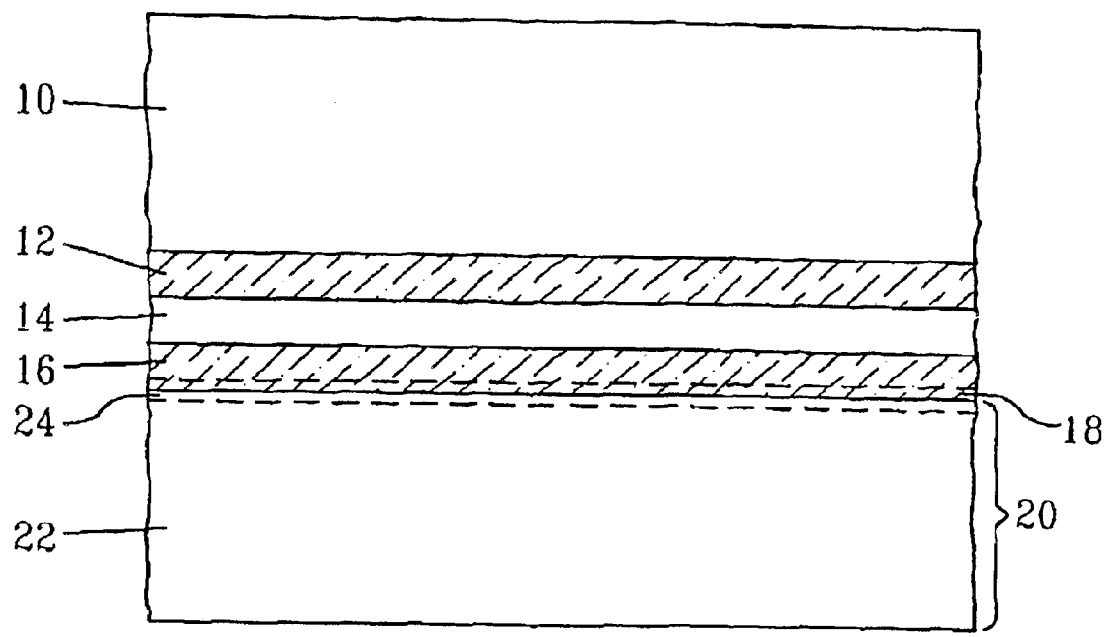

After thermal oxide film 16 is formed on the surface of Si-containing layer 14, the thermal oxide film is subjected to a cleaning process which is capable of converting the surface of the oxide film into a surface that is hydrophilic. That is, the cleaning process provides a thermal oxide having a surface that has a strong affinity for water. The resulting structure is shown in FIG. 1C wherein reference numeral 18 is used to denote the hydrophilic surface region of the thermal oxide layer. Specifically, the hydrophilic surface region is formed utilizing deionized water, a mixture of ammonium hydroxide and peroxide, HCl, or any other solvent which is capable of forming such a region on a thermal oxide film.

FIG. 1C also shows carrier wafer 20 which comprises Si-containing material 22 having an upper surface region that is also hydrophilic in nature. The hydrophilic surface region of carrier wafer 20 is denoted by reference numeral 24. The Si-containing material of carrier wafer 20 may be the same or different from that of the Si-containing layer of the SOI substrate. Thus, for example, the Si-containing material may be comprised of Si, SiGe, SiC, SiGeC, Si/Si, Si/SiC, or Si/SiGeC. The carrier wafer is formed using conventional techniques well known to those skilled in the art, and the hydrophilic surface can be formed utilizing a cleaning process similar to the one used in forming the hydrophilic surface layer of the thermal oxide film.

The Si-containing material may be doped or undoped. In embodiments where the Si-containing material of the carrier wafer is doped, it is possible to have one or more discrete doped regions within the Si-containing material. For example, the Si-containing material of the carrier wafer may have a highly (on the order of $10^{19}$ cm$^{-3}$ or greater) doped P$^+$ or N$^+$ region located at a predetermined distance from the hydrophilic surface, and a lower doped region of opposing conductivity at or near the hydrophilic surface of the carrier wafer. Such a carrier wafer, which is not specifically shown, is suitable for use in double-gated MOSFETs.

As is shown in FIG. 1C, carrier wafer 20 is positioned adjacent to the thermal oxide-containing SOI substrate such that the hydrophilic surfaces of the carrier wafer and the SOI substrate are adjoining each other. Specifically, the positioning step of the present invention ensures that hydrophilic surface region 24 of carrier wafer 20 is in intimate contact with hydrophilic surface 18 of thermal oxide film 16. The positioning step of the present invention may be performed by human means or mechanical means.

After positioning the carrier wafer and the thermal oxide-containing SOI substrate in the manner illustrated in FIG. 1C, the two structures are bonded together utilizing a room temperature bonding process. The term "room temperature bonding process" denotes a bonding process that is carried out at a temperature of from about 18° to about 27° C., with a temperature of from about 20° to about 25° C. being more highly preferred. The room temperature bonding process is typically carried out in an inert ambient such as He or Ar and an external force may be applied to the structure to aide in the bonding process. The bonded structure formed after the room temperature bonding process of the present invention has been carried out is shown, for example, in FIG. 1D.

Figure 1D:
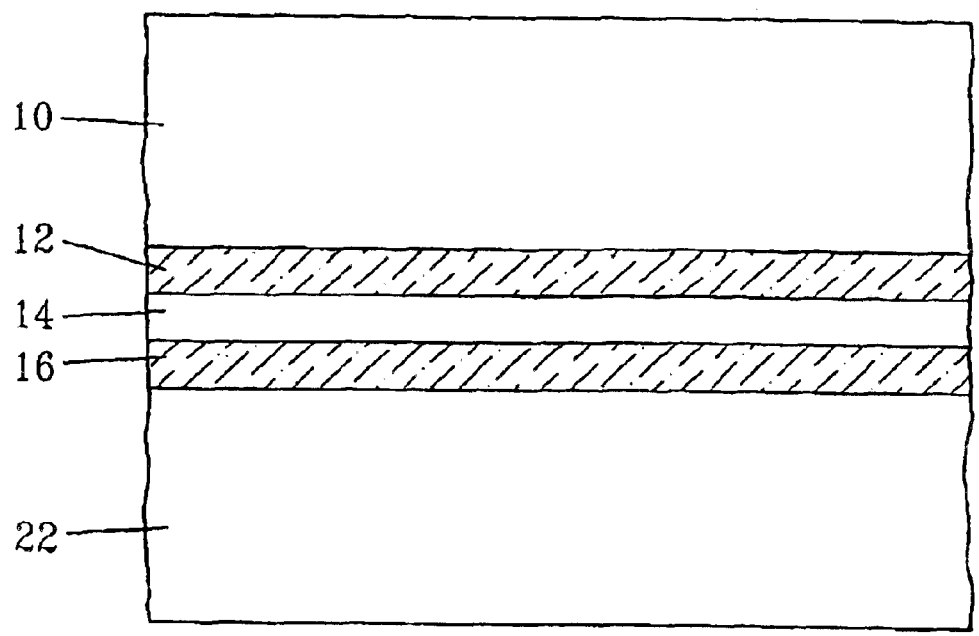
Figure 1E:
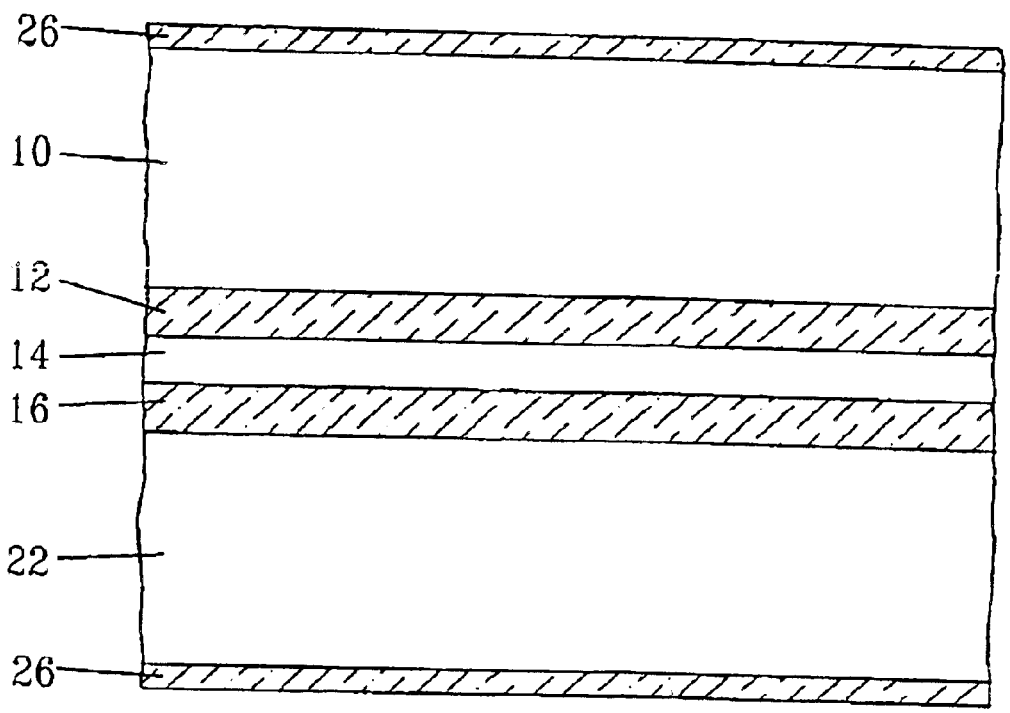

After the room temperature bonding process has been performed, the bonded structure illustrated in FIG. 1D is subjected to an annealing process which forms an oxide on all exposed Si surfaces of the bonded structure. FIG. 1E illustrates the structure that is formed after the annealing step has been performed. In the annealed and bonded structure shown in FIG. 1E, reference numeral 26 denotes the oxide which is formed on the exposed Si surfaces of Si-containing material 22 and Si-containing substrate 10. The oxide formed by this annealing step is a sacrificial oxide that will be removed in a subsequent processing step of the present invention. The oxide formed by the annealing step of the present invention has a thickness of from about 150 to about 250 nm.

Specifically, the annealing step of the present invention is performed in an oxygen-containing ambient at a temperature of from about 300° to about 1000° C. for a time period of from about 1 to about 5 hours. More preferably, the annealing step of the present invention is carried out at a temperature of about 800° C. for a time period of about 2 hours. The annealing step may include various ramp and soak cycles, or a single ramp and heating temperature may be used.

As stated above, the annealing step is performed in an oxygen-containing ambient. Specifically, the annealing step of the present invention is carried out in an oxygen-containing ambient which includes, for example: $O_2$, NO, $N_2O$, ozone, steam and air. The oxygen-containing ambient may be comprised of an admixture of oxygen-containing gases such $O_2$ and NO, or the oxygen-containing ambient may be diluted with an inert gas such as He, Ar, $N_2$, Xe, Kr, or Ne.

It should be noted that the bonding and annealing steps of the present invention are permitted to be carried out at substantially low temperatures so as to avoid the out-diffusion of dopants from one region of the bonded structure to another region within the bonded structure.

The sacrificial oxide formed on the Si-containing substrate of the SOI substrate is then removed utilizing an etching process that is highly selective in removing oxide as compare to Si. For example, a dry etching process such as reactive-ion etching or plasma etching may be used in removing oxide 26 from the bonded and annealed structure. Oxide layer 26 may also be removed utilizing a wet chemical etching process where an etchant such as HF may be used to selectively remove the surface oxide from the structure. Alternatively, the surface oxide formed atop the Si-containing substrate by the annealing step may be removed from the structure by a grinding process. Note that the sacrificial oxide formed on the Si-containing wafer or the carrier wafer may, or may not be removed at this point of the present. Preferably, and as shown, the oxide formed on the carrier wafer is not removed from the structure at this point of the present invention.

Figure 1F:
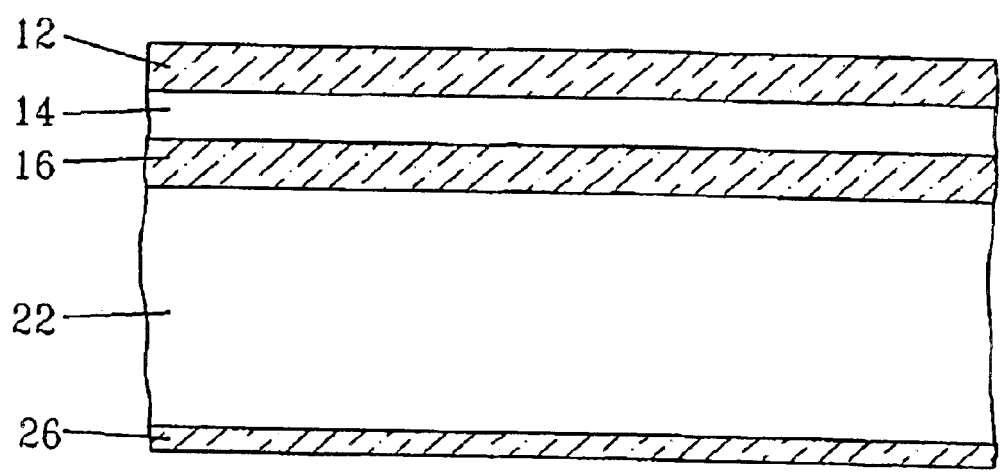

After removing the oxide from the surface of the Si-containing substrate, the Si-containing substrate is then removed utilizing an etching process that is highly selectively in removing Si as compared with oxide. An illustrative example of one type of etching process that can be used to selectively remove the Si-containing substrate is a wet etching process wherein KOH or another suitable etchant is employed. Note that the etching process of the process invention exposes buried oxide region 12 of the original SOI substrate. The resulting structure containing the now exposed buried oxide region is shown, for example, in FIG. 1F.

Figure 1G:
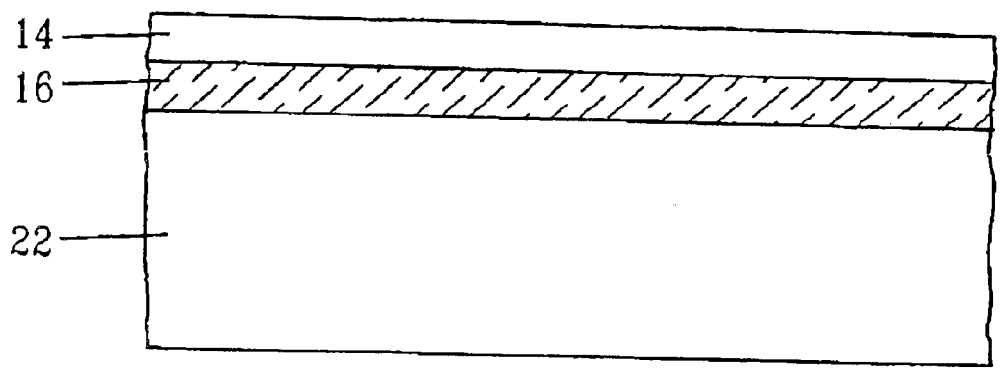

Next, the exposed buried oxide region is removed from the structure using an etching process that is highly selective in removing oxide as compared to Si. Note that if the previous surface oxide layer formed on the carrier wafer was not previously removed, this etching step of the present invention may be used to also remove that surface oxide layer from the structure. Although any etching process that is highly selective for removing oxide can be employed in the present invention, it is preferred that a chemical wet etching process that employs HF be used in the present invention. The resultant structure that is formed after this step of the present invention has been performed is shown, for example, in FIG. 1G. Note that Si-containing layer 14 of the bonded and annealed structure is now exposed.

The resultant structure, i.e., SOI wafer, formed by the present invention (See, for example, FIG. 1G) comprises thermal oxide layer 16 which is sandwiched between Si-containing layer 14 and Si-containing material 22. The thermal oxide of the final SOI wafer formed by the inventive method is thin (having a thickness of from about 30 to about 100 Å) and is of gate-quality.

If Si-containing layer 14 is not of a desired thickness, the Si-containing layer may now be thinned to any desired thickness utilizing repeated oxidation and HF removal processing steps. Repeated oxidation and HF removal will guarantee excellent thickness uniformity of the final Si-containing layer.

It is again emphasized that the SMART cut technology of the prior art may not be used to produce SOI wafers having a very thin oxide layer (30–100 Å) sandwiched between two Si-containing layers. The reason that SMART cut technology cannot be used in fabricating such SOI wafers is that SMART cut technology relies on the implantation of hydrogen ions in a Si wafer to form a uniform cut upon annealing the wafer at elevated temperatures.

While the present invention has been particularly shown and described with respect to preferred embodiments thereof, it will be understood by those skilled in the art that the foregoing and other changes in forms and details made be made without departing from the spirit and scope of the present invention. It is therefore intended that the present invention not be limited to the exact forms and details described and illustrated, but fall within the scope of the appended claims.

What is claimed is:

1. A bonded structure comprising:
   a silicon-on-insulator substrate having a substantially uniform thermal oxide film present atop a Si-containing layer, said thermal oxide having a hydrophilic surface region; and
   a carrier wafer comprising a Si-containing semiconductor selected from the group consisting of Si, SiGe, SiGeC, Si/Si, Si/SiC and Si/SiGeC, and having a hydrophilic Si-containing semiconductor surface, wherein said hydrophilic surfaces are bonded together.

2. The bonded structure of claim 1 wherein said thermal oxide film has a thickness of from about 30 to about 100 Å.

3. The bonded structure of claim 1 wherein said silicon-on-insulator substrate comprising a buried oxide region sandwiched between a Si-containing layer and a Si-containing substrate.

4. The bonded structure of claim 3 wherein said buried oxide region is a non-thermal oxide.

5. The bonded structure of claim 3 wherein said buried oxide is a thermal oxide.

6. The bonded structure of claim 1 wherein said carrier wafer is comprised of a Si-containing material.

7. The bonded structure of claim 1 wherein portions of said silicon-on-insulator substrate are removed to provide a SOI wafer that comprises said thermal oxide film sandwiched between two Si-containing layers, said thermal oxide having a thickness of from about 30 to about 100 Å.

* * * * *